US010615811B2

(12) United States Patent
Wu et al.

(10) Patent No.: US 10,615,811 B2
(45) Date of Patent: Apr. 7, 2020

(54) SUCCESSIVE APPROXIMATION REGISTER ANALOG-TO-DIGITAL CONVERTER AND ASSOCIATED METHOD

(71) Applicant: Realtek Semiconductor Corp., HsinChu (TW)

(72) Inventors: Cheng-Hui Wu, Kaohsiung (TW); Yu-Chang Chen, New Taipei (TW); Chih-Lung Chen, Hsinchu County (TW); Shih-Hsiung Huang, Miaoli County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 15/953,514

(22) Filed: Apr. 16, 2018

(65) Prior Publication Data

US 2019/0245546 A1 Aug. 8, 2019

(30) Foreign Application Priority Data

Feb. 7, 2018 (TW) .............................. 107104249 A

(51) Int. Cl.
*H03M 1/12* (2006.01)
*H03M 1/00* (2006.01)
*H03K 5/24* (2006.01)
*H03K 19/20* (2006.01)

(52) U.S. Cl.
CPC .............. *H03M 1/002* (2013.01); *H03K 5/24* (2013.01); *H03K 19/20* (2013.01)

(58) Field of Classification Search
CPC ........ H03M 1/125; H03M 1/462; H03M 1/38; H03M 1/46; H03M 1/12; H03M 1/00

USPC ................................. 341/155, 118, 144, 163
See application file for complete search history.

(56) References Cited

U.S. PATENT DOCUMENTS

| 8,786,483 | B1 * | 7/2014 | Thompson | .......... H03M 1/0836 |
| | | | | 341/120 |
| 9,473,163 | B1 * | 10/2016 | Tsai | ....................... H03M 1/466 |
| 9,484,945 | B1 * | 11/2016 | Wan | ......................... H03M 1/46 |
| 9,577,660 | B1 * | 2/2017 | Kang | ........................ H03M 1/46 |
| 9,584,144 | B1 * | 2/2017 | Zhou | .................... H03K 5/15026 |
| 9,614,540 | B1 * | 4/2017 | Kull | ......................... H03M 1/462 |
| 9,621,179 | B1 * | 4/2017 | Maulik | .................. H03M 1/466 |
| 10,044,364 | B1 * | 8/2018 | Sharif | ..................... H03M 1/38 |

(Continued)

FOREIGN PATENT DOCUMENTS

WO 2016/166002 A1 10/2016

*Primary Examiner* — Linh V Nguyen
(74) *Attorney, Agent, or Firm* — Winston Hsu

(57) ABSTRACT

A Successive Approximation Register (SAR) Analog-to-digital converter (ADC) includes: a digital-to-analog converter (DAC), a comparison circuit and a logic circuit. The DAC is configured to generate a transformed voltage according to a digital signal and a reference voltage, and the digital signal is generated by a digital signal generating circuit. The comparison circuit is coupled to the DAC and configured to compare the transformed voltage and an input voltage to generate a comparison result, and further configured to receive a control signal. The logic circuit is coupled to the comparison circuit, and configured to perform a logic transform operation upon the comparison result to generate an output signal to the digital signal generating circuit and the comparison circuit. The control signal controls the comparison circuit to enable or disable the SAR ADC.

20 Claims, 4 Drawing Sheets

(56) References Cited

U.S. PATENT DOCUMENTS 10,050,639 B1* 8/2018 Berens .................. H03M 1/069
2013/0285844 A1* 10/2013 Lin ........................ H03M 1/12
341/110

* cited by examiner

SUCCESSIVE APPROXIMATION REGISTER ANALOG-TO-DIGITAL CONVERTER AND ASSOCIATED METHOD

BACKGROUND OF THE INVENTION

1. Field of the Invention

The present invention relates to a successive approximation register (SAR) analog-to-digital converter (ADC) and a method related thereto.

2. Description of the Prior Art

In a conventional SAR ADC, a control signal is utilized to enable or disable the SAR ADC. However, the mechanism used for generating the control signal might affect the operating speed of the SAR ADC, and may consume additional power. Therefore, a novel SAR ADC architecture is required.

SUMMARY OF THE INVENTION

One of the objectives of the present invention is to provide an SAR ADC and an associated method to solve the aforementioned problem.

According to an embodiment of the present invention, an SAR ADC is disclosed. The SAR ADC comprises a digital-to-analog converter (DAC), a comparison circuit, and a logic circuit. The DAC is configured to generate a converted analog voltage according to a digital signal and a reference voltage, and the digital signal is generated by a digital signal generating circuit coupled to the DAC. The comparison circuit is coupled to the DAC, and the comparison circuit is configured to compare the converted analog voltage and an input voltage to generate a comparison result, and further configured to receive a control signal. The logic circuit is coupled to the comparison circuit, and executes a logic conversion operation upon the comparison result to generate an output signal to the digital signal generating circuit and the comparison circuit. The control signal controls the comparison circuit to enable or disable the SAR ADC.

According to an embodiment of the present invention, a method applicable to an SAR ADC is disclosed and comprises: generating a converted analog voltage according to a digital signal and a reference voltage; utilizing a comparison circuit to compare the converted analog voltage and an input voltage to generate a comparison result, and to receive a control signal; and utilizing a logic circuit to execute a logic conversion operation upon the comparison result to generate an output signal. The control signal is configured to enable or disable the SAR ADC.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
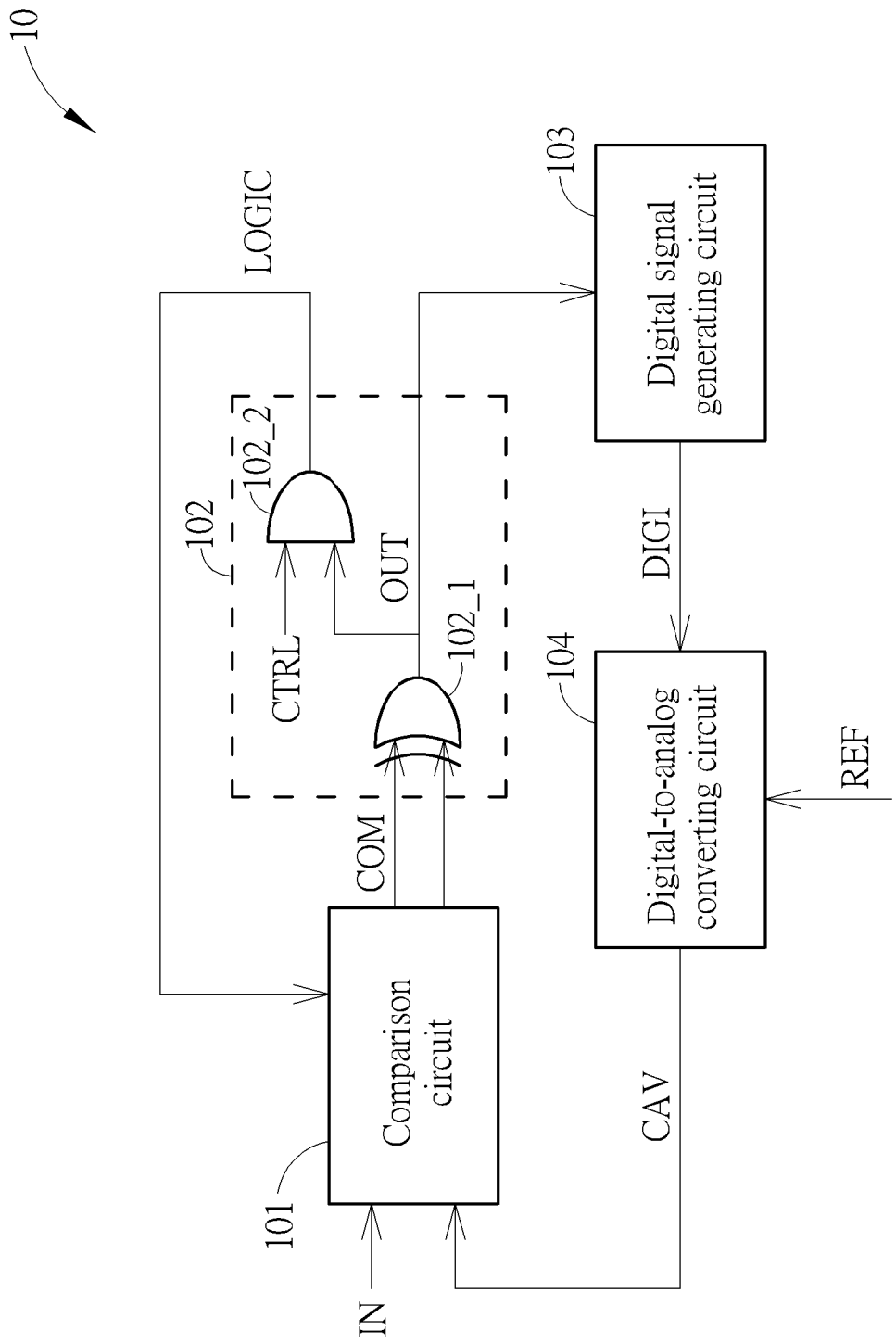
FIG. 1 is a diagram illustrating an SAR ADC implemented by at least one logic gate.

Refer to FIG. 1, which is a diagram illustrating a successive approximation register (SAR) analog-to-digital converter (ADC) 10 implemented by at least one logic gate. The SAR ADC 10 comprises a comparison circuit 101, a logic circuit 102, a digital signal generating circuit 103, and a digital-to-analog converter (DAC) 104. The digital signal generating circuit 103 is configured to receive an output signal OUT generated by the logic circuit 102, and generates a digital signal DIGI accordingly. The DAC 104 executes a digital-to-analog operation according to the digital signal DIGI and a reference voltage REF, and generates a converted analog voltage CAV to the comparison circuit 101. The comparison circuit 101 generates a comparison result COM according to the converted analog voltage CAV generated by the DAC 104 and an input voltage IN. As shown in FIG. 1, the comparison result COM is a differential signal which is received by the logic circuit 102. The logic circuit 102 comprises an exclusive OR (XOR) gate 102_1 whose two input terminals are configured to receive the comparison result COM, and the generated output signal OUT and the control signal CTRL are received by an AND gate 102_2 of the logic circuit 102 to generate a logic signal LOGIC. The logic signal LOGIC is feedback to the comparison circuit 101. The control signal CTRL is the control signal configured to enable or disable the SAR ADC 10. The control signal CTRL is only utilized at the beginning and the end of the operation; however, the process of the AND gate 102_2 is inevitable for every bit when the SAR ADC 10 executes the analog-to-digital operation which results in slowing down of the operation and extra power consumption. Therefore, the present invention provides a novel SAR ADC architecture which can effectively solve the aforementioned problem of the SAR ADC 10. In some embodiments, the AND gate 102_2 can be replaced by an OR gate. In addition, the XOR gate 102_1 of the logic circuit 102 can be implemented by multiple NOR gates or by multiple NAND gates, which should be readily understood by those skilled in the art. In other words, the implementation of the XOR gate 102_1 is not limited.

Figure 2:
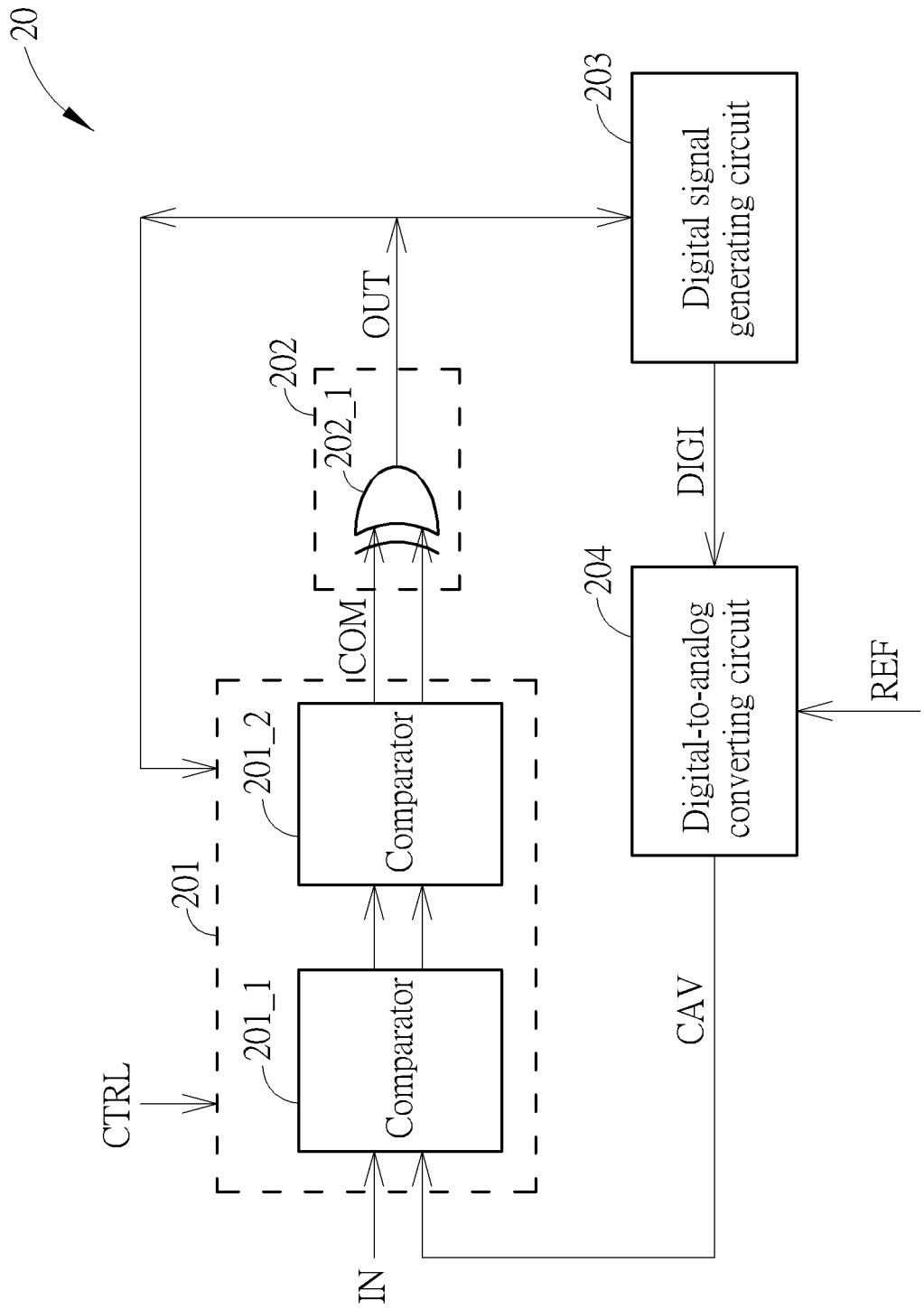
FIG. 2 is a diagram illustrating an SAR ADC according to an embodiment of the present invention.

FIG. 2 is a diagram illustrating an SAR ADC 20 according to an embodiment of the present invention. As shown in FIG. 2, the SAR ADC 20 comprises a comparison circuit 201, a logic circuit 202, a digital signal generating circuit 203 and a DAC 204. As the SAR ADC 10 shown in FIG. 1, the digital signal generating circuit 203 of the SAR ADC 20 is configured to receive the output signal OUT generated by the logic circuit 202, and generates a digital signal DIGI accordingly. The DAC 204 executes a digital-to-analog operation according to the digital signal DIGI and a reference voltage REF, and generates a converted analog voltage CAV to the comparison circuit 201. The comparison circuit 201 generates a comparison result COM according to the converted analog voltage CAV generated by the DAC 104 and an input voltage IN. As shown in FIG. 2, the comparison result COM is a differential signal, and is received by the logic circuit 202. The difference between the SAR ADC 10 and the SAR ADC 20 is that the logic circuit 202 only comprises an XOR gate 202_1 to execute a logic conversion operation upon the comparison signal COM without requiring an additional AND gate to receive the output signal OUT and the control signal CTRL. The comparison circuit 201 is further configured to receive the control signal CTRL for enabling/disabling the SAR ADC 20. It should be noted that, in other embodiments, the XOR 202_1 of the logic circuit 202 can be replaced by a NOR gate. In addition, before being transmitted to the comparison circuit 201, the output signal OUT may pass through another inverter to increase the driving ability. Those skilled in the art should readily understand the function and implementation of each logic gate, and therefore understand that the particular logic gate which is used is not a limitation of the present invention. In this embodiment, the comparison circuit 201 comprises comparators 201_1 and 201_2. The control signal CTRL may couple to one of the comparators 201_1 and 201_2 for enabling/disabling the SAR ADC 20; however, the number of comparators in the comparison circuit 201 is not a limitation of the present invention. In other embodiments, the comparison circuit 201 may comprise one or more than two comparators. The architecture of the comparators 201_1 and 201_2 will be discussed in the following paragraphs. In addition, the comparison circuit 201 may comprise more than the comparators 201_1 and 201_2. In other embodiments, the output terminal of the comparison circuit 201 may further couple to a plurality of buffers to increase the driving ability of the signal for driving the loading. It should be noted that the architecture of the digital signal generating circuit 203 and the DAC 204 is not a limitation of the present invention. Those skilled in the art should readily understand that other implementations of the digital signal generating circuit 203 and the DAC 204 are possible. For example, the DAC 203 may be a capacitive DAC comprising a plurality of capacitors coupled to a plurality of corresponding switches which are activated/deactivated to charge/discharge the plurality of capacitors according to the digital signal DIGI generated by the digital signal generating circuit 203 which generates the converted analog voltage CAV accordingly. The implementation of the capacitive DAC is a well-known prior art technology; the detailed description is therefore omitted here for brevity. In addition, as mentioned above, those skilled in the art should readily understand that the XOR gate 202_1 of the logic circuit 202 can be implemented by multiple NOR gates or NAND gates, and each reference to the XOR gate may also be multiple NOR gates or NAND gates. In other words, the implementation of the XOR gate 202_1 is not limited.

Figure 3:
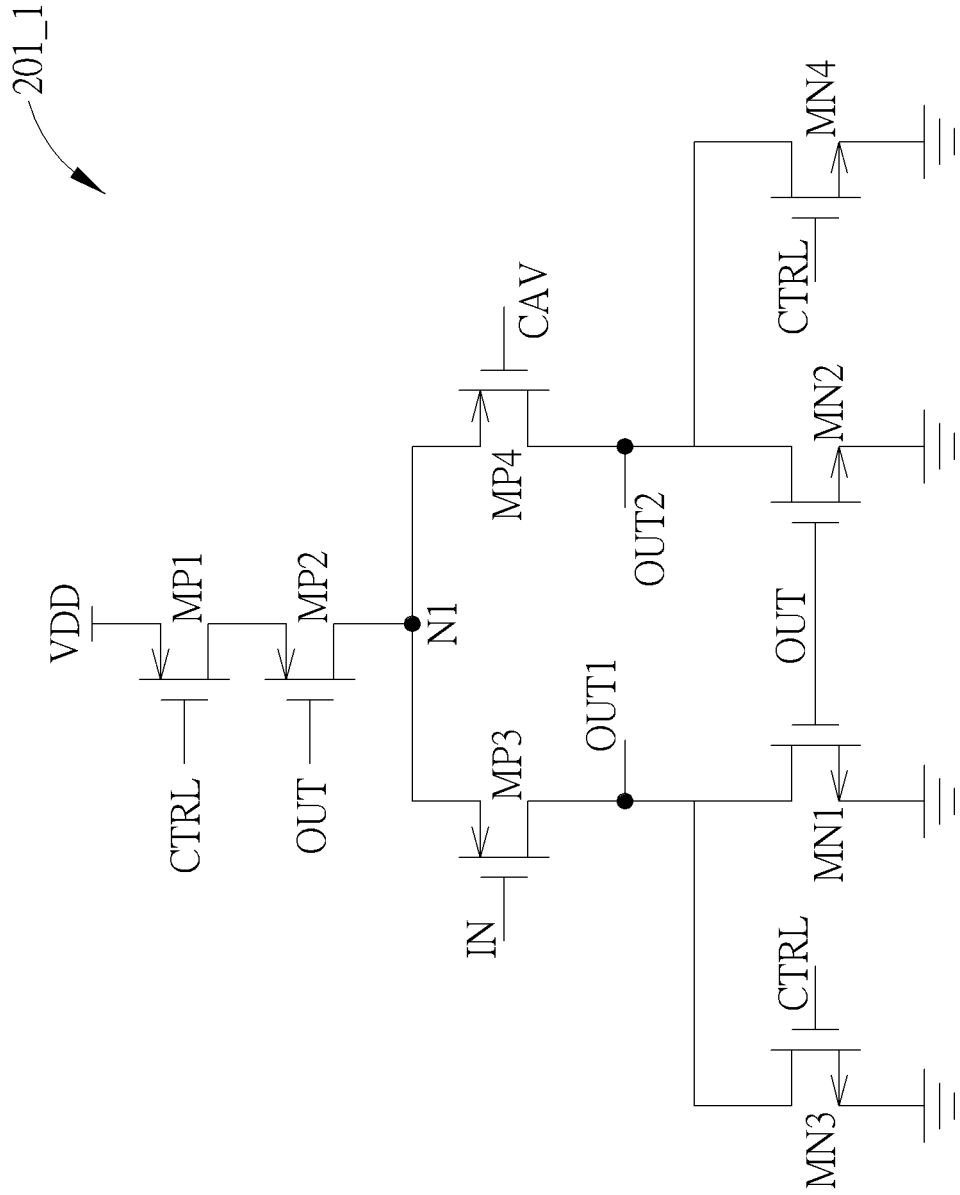
FIG. 3 is a diagram illustrating a comparator configured to receive a control signal according to an embodiment of the present invention.

FIG. 3 is a diagram illustrating the comparator 201_1 configured to receive the control signal CTRL according to an embodiment of the present invention. As shown in FIG. 3, the comparator 201_1 comprises P-type Metal-Oxide-Semiconductor Field-Effect Transistors (MOSFETs) MP1-MP4 and N-type MOSFETs MN1-MN4. A source terminal of the P-type MOSFET (hereinafter PMOS) MP1 couples to a reference voltage (e.g. a supply voltage VDD shown in FIG. 3), a drain terminal of the PMOS MP1 couples to a source terminal of the PMOS MP2, and a gate terminal of the PMOS MP1 couples to the control signal CTRL; a drain terminal of the PMOS MP2 couples to a terminal N1, and a gate terminal of the PMOS MP2 couples to the output signal OUT generated by the logic circuit 202; a source terminal of the PMOS MP3 couples to the terminal N1, a drain terminal of the PMOS MP3 couples to a drain terminal of the N-type MOSFET (hereinafter NMOS) MN1, and a gate terminal of the PMOS MP3 couples to the input signal IN; and a source terminal of the PMOS MP4 couples to the terminal N1, a drain terminal of the PMOS MP4 couples to a drain terminal of the NMOS MN2, and a gate terminal of the PMOS MP4 couples to the converted analog voltage CAV. It should be noted that, because the comparator 201_1 utilizes differential inputs, the gate terminal of the PMOS MP3 can also couple to the converted analog voltage CAV while the gate terminal of the PMOS MP4 can couple to the input voltage IN. Those skilled in the art should readily understand that these connections do not affect the operation. In addition, as shown in FIG. 3, the PMOSs MP3 and MP4 generate output signals OUT1 and OUT2 at the drain terminal, respectively. A source terminal of the NMOS MN1 couples to a ground voltage, a drain terminal of the NMOS MN1 couples to the drain terminal of the PMOS MP3, and a gate terminal of the NMOS MN1 couples to the output signal OUT; a source terminal of the NMOS MN2 couples to the ground voltage, a drain terminal of the NMOS MN2 couples to the drain terminal of the PMOS MP4, and a gate terminal of the NMOS MN2 couples to the output signal OUT; a source terminal of the NMOs MN3 couples to the ground voltage, a drain terminal of the NMOS MN3 couples to the drain terminal of the PMOS MP3, and a gate terminal of the NMOS MN3 couples to the control signal CTRL; and a source terminal of the NMOS MN4 couples to the ground voltage, a drain terminal of the NMOS MN4 couples to the drain terminal of the PMOS MP4, and a gate terminal of the NMOS MN4 couples to the control signal CTRL. As shown in FIG. 3, the PMOSs MP1 and MP2 and the NMOSS MN3 and MN4 are used as current generating circuits for generating current, and the control signal CTRL controls the on/off status of the PMOS MP1 and the NMOSs MN3 and MN4. When the SAR ADC 20 needs to be enabled, the control signal CTRL is logic low (e.g. logic value '0') to activate the PMOS MP1 and deactivate the NMOSs MN3 and MN4. The comparator 201_1 therefore has enough driving current to operate normally; when the SAR ADC 20 needs to be disabled, the control signal CTRL is logic high (e.g. logic value '1') to deactivate the PMOS MP1 and activate the NMOSs MN3 and MN4. The comparator 201_1 will therefore be turned off due to the lack of driving current, and the SAR ADC 20 is indirectly disabled. Those skilled in the art should readily understand that the comparator 201_1 can be implemented by a Complementary Metal-Oxide-Semiconductor (CMOS). Therefore, the PMOSs and the NMOSs in the architecture shown in FIG. 3 can be exchanged, and the logic value of the control signal CTRL for enabling/disabling the SAR ADC 20, will accordingly change.

Figure 4:
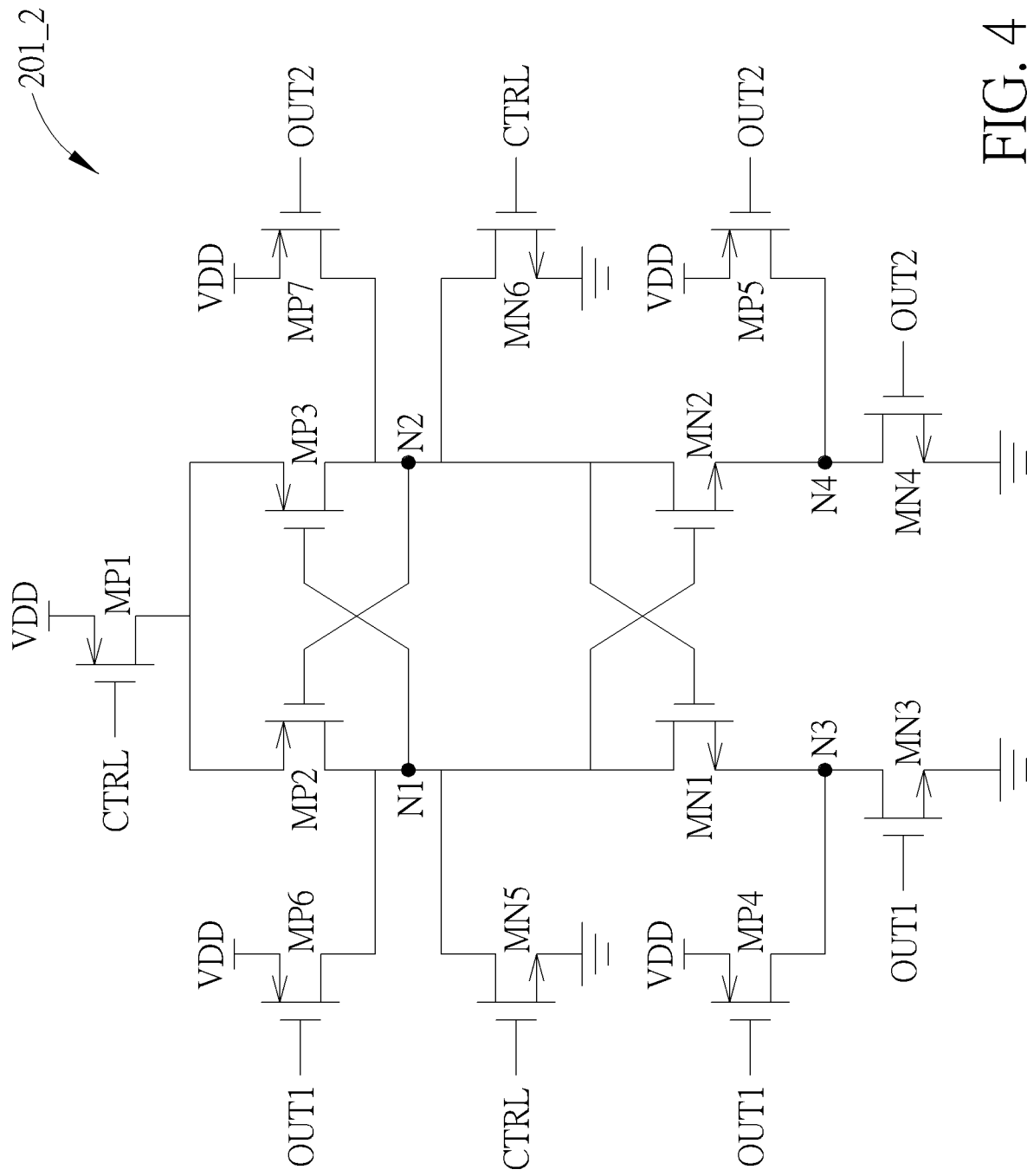
FIG. 4 is a diagram illustrating another comparator configured to receive a control signal according to an embodiment of the present invention.

FIG. 4 is a diagram illustrating the comparator 201_2 configured to receive the control signal CTRL according to an embodiment of the present invention. As shown in FIG. 4, the comparator 201_2 comprises PMOSs MP1-MP7 and NMOSs MN1-MN6. A source terminal of the PMOS MP1 couples to the supply voltage VDD, a gate terminal of the PMOS MP1 couples to the control signal CTRL, and a drain terminal of the PMOS MP1 couples to source terminals of the PMOSs MP2 and MP3; a drain terminal of the PMOS MP2 couples to a terminal N1, and a gate terminal of the PMOS MP2 couples to a terminal N2; a drain terminal of the PMOS MP3 couples to the terminal N2, and a gate terminal of the PMOS MP3 couples to the terminal N1; a source terminal of the PMOS MP4 couples to the supply voltage VDD, a gate terminal of the PMOS MP4 couples to the output signal OUT1 generated by the comparator 201_1, and a drain terminal of the PMOS MP4 couples to a terminal N3; a source terminal of the PMOS MP5 couples to the supply voltage VDD, a gate terminal of the PMOS MP5 couples to the output signal OUT2 generated by the comparator 201_1, and a drain terminal of the PMOS MP5 couples to a terminal N4; a source terminal of the PMOS MP6 couples to the supply voltage VDD, a gate terminal of the PMOS MP6 couples to the output signal OUT1 generated by the comparator 201_1, and a drain terminal of the PMOS MP6 couples to the terminal N1; a source terminal of the PMOS MP7 couples to the supply voltage VDD, a gate terminal of the PMOS MP7 couples to the output signal OUT2 generated by the comparator 201_1, and a drain terminal of the PMOS MP7 couples to the terminal N2; a source terminal of the NMOS MN1 couples to the terminal N3, a gate terminal of the NMOS MN1 couples to the terminal N2, and a drain terminal of the NMOS MN1 couples to the terminal N1; a source terminal of the NMOS MN2 couples to a terminal N4, a gate terminal of the NMOS MN2 couples to the terminal N1, and a drain terminal of the NMOS MN2 couples to the terminal N2; a source terminal of the NMOS MN3 couples to the ground voltage, a gate terminal of the NMOS MN3 couples to the output signal OUT1, and a drain terminal of the NMOS MN3 couples to the terminal N3; a source terminal of the NMOS MN4 couples to the ground voltage, a gate terminal of the NMOS MN4 couples to the output signal OUT2, and a drain terminal of the NMOs MN4 couples to the terminal N4; a source terminal of the NMOS MN5 couples to the ground voltage, a gate terminal of the NMOS MN5 couples to the control signal CTRL, and a drain terminal of the NMOS MN5 couples to the terminal N1; and a source terminal of the NMOS MN6 couples to the ground voltage, a gate terminal of the NMOS MN6 couples to the control signal CTRL, and a drain terminal of the NMOS MN6 couples to the terminal N2. As with the comparator 201_1, the control signal CTRL also controls the PMOS MP1 and NMOSs MN5 and MN6 according to the logic value thereof. The detailed description is omitted here for brevity. Likewise, the PMOSs and the NMOSs in the architecture shown in FIG. 4 can be exchanged. In this way, the logic value of the control signal CTRL for enabling/disabling the SAR ADC 20 will accordingly change.

Briefly summarized, the present invention provides an SAR ADC which directly couples the control signal to the comparison circuit to save at least one AND gate. In this way, the time for executing the analog-to-digital converting operation can be effectively reduced, and the power can also be effectively saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A successive approximation register (SAR) analog-to-digital converter (ADC), comprising:
    a digital-to-analog converter (DAC), configured to generate a converted analog voltage according to a digital signal and a reference voltage, wherein the digital signal is generated by a digital signal generating circuit coupled to the DAC;
    a comparison circuit, that is coupled to the DAC, that is configured to compare the converted analog voltage and an input voltage to generate a comparison result, and that is configured to receive a control signal and an output signal, the control signal and the output signal both being logic signals and both being received at a same time; and
    a logic circuit, coupled to the comparison circuit and configured to execute a logic conversion operation upon the comparison result to generate the output signal to the digital signal generating circuit and the comparison circuit, and the logic circuit does not comprise an AND gate;
wherein the control signal controls the comparison circuit for enabling or disabling the SAR ADC.

2. The SAR ADC of claim 1, wherein the comparison circuit comprises at least one comparator, the control signal controls one of the at least one comparator to enable/disable the SAR ADC.

3. The SAR ADC of claim 2, wherein the at least one comparator comprises a first comparator and a second comparator, and the control signal controls at least one current generating circuit of the first comparator to enable/disable the SAR ADC.

4. The SAR ADC of claim 3, wherein the at least one current generating circuit of the first comparator comprises at least one first current generating circuit and at least one second current generating circuit, and when the SAR ADC is disabled, the control signal deactivates the at least one first current generating circuit to stop providing current and activates the at least one second current generating circuit.

5. The SAR ADC of claim 4, wherein each of the at least one first current generating circuits comprises a P-type Metal-Oxide-Semiconductor Field-Effect Transistor (MOSFET), and each of the at least one second current generating circuits comprises an N-type MOSFET.

6. The SAR ADC of claim 5, wherein the control signal couples to a gate terminal of each of the P-type MOSFET and the N-type MOSFET, and when the SAR ADC is disabled, the control signal deactivates the P-type MOSFET and activates the N-type MOSFET.

7. The SAR ADC of claim 3, wherein the at least one current generating circuit of the first comparator comprises at least one first current generating circuit and at least one second current generating circuit, and when the SAR ADC is enabled, the control signal activates the at least one first current generating circuit and deactivates the at least one second current generating circuit to stop providing current.

8. The SAR ADC of claim 7, wherein each of the at least one first current generating circuits comprises a P-type Metal-Oxide-Semiconductor Field-Effect Transistor (MOSFET), and each of the at least one second current generating circuits comprises an N-type MOSFET.

9. The SAR ADC of claim 8, wherein the control signal couples to a gate terminal of each of the P-type MOSFET and the N-type MOSFET, and when the SAR ADC is enabled, the control signal activates the P-type MOSFET and deactivates the N-type MOSFET.

10. The SAR ADC of claim 1, wherein the logic circuit comprises a NOR gate or a NAND gate.

11. A method applied to a successive approximation register (SAR) analog-to-digital converter (ADC), comprising:
    generating a converted analog voltage according to a digital signal and a reference voltage;
    utilizing a comparison circuit to compare the converted analog voltage and an input voltage to generate a comparison result, and receiving a control signal and an output signal, the control signal and the output signal both being logic signals and both being received at a same time;
    utilizing a logic circuit to execute a logic conversion operation upon the comparison result to generate the output signal, wherein the logic circuit does not comprise an AND gate;
wherein the control signal is configured to enable or disable the SAR ADC.

12. The method of claim 11, the comparison circuit comprises at least one comparator, the control signal controls one of the at least one comparator to enable/disable the SAR ADC.

13. The method of claim 12, wherein the at least one comparator comprises a first comparator and a second comparator, the control signal controls at least one current generating circuit of the first comparator to enable/disable the SAR ADC.

14. The method of claim 13, wherein the at least one current generating circuit of the first comparator comprises at least one first current generating circuit and at least one second current generating circuit, and when the SAR ADC is disabled, the control signal deactivates the at least one first current generating circuit to stop providing current and activates the at least one second current generating circuit.

15. The method of claim 14, wherein each of the at least one first current generating circuits comprises a P-type Metal-Oxide-Semiconductor Field-Effect Transistor (MOSFET), and each of the at least one second current generating circuits comprises an N-type MOSFET.

16. The method of claim 15, wherein the control signal couples to a gate terminal of each of the P-type MOSFET and the N-type MOSFET, and when the SAR ADC is disabled, the control signal deactivates the P-type MOSFET and activates the N-type MOSFET.

17. The method of claim 13, wherein the at least one current generating circuit of the first comparator comprises at least one first current generating circuit and at least one second current generating circuit, and when the SAR ADC is enabled, the control signal activates the at least one first current generating circuit and deactivates the at least one second current generating circuit to stop providing current.

18. The method of claim 17, wherein each of the at least one first current generating circuits comprises a P-type Metal-Oxide-Semiconductor Field-Effect Transistor (MOSFET), and each of the at least one second current generating circuits comprises an N-type MOSFET.

19. The method of claim 18, wherein the control signal couples to a gate terminal of each of the P-type MOSFET and the N-type MOSFET, and when the SAR ADC is enabled, the control signal activates the P-type MOSFET and deactivates the N-type MOSFET.

20. The method of claim 11, wherein the logic circuit comprises a NOR gate or a NAND gate.

* * * * *